United States Patent [19]

Korwin-Pawlowski

[11] Patent Number: 4,829,406

[45] Date of Patent: May 9, 1989

[54] SQUARE BODY LEADLESS ELECTRICAL DEVICE

[75] Inventor: Michael Korwin-Pawlowski, Fort Salonga, N.Y.

[73] Assignee: General Instrument Corp., New York, N.Y.

[21] Appl. No.: 164,219

[22] Filed: Mar. 4, 1988

[51] Int. Cl.$^4$ .......................... H01G 9/00; H01G 9/16
[52] U.S. Cl. ........................................ 357/72; 361/436
[58] Field of Search ............... 361/306, 402, 404, 410, 361/433, 436; 357/72

[56] References Cited

U.S. PATENT DOCUMENTS

| | | | |
|---|---|---|---|
| 3,458,783 | 7/1969 | Rosenberg | 361/308 |
| 4,558,399 | 12/1985 | Toyama et al. | 361/433 |
| 4,564,885 | 1/1986 | McCann | 361/436 |
| 4,757,610 | 7/1988 | McElheney et al. | 361/433 X |

OTHER PUBLICATIONS

I.B.M. Technical Disclosure Bulletin, Aug. 1985, vol. 28, No. 3, p. 1310.

Primary Examiner—Donald A. Griffin
Attorney, Agent, or Firm—James & Franklin

[57] ABSTRACT

An electrical device designed for leadless surface mounting on a PC board has molding compound which surrounds the electrical component and is so shaped as to have an outer surface which defines a flat, so that when the device is placed on the board it will remain in proper location and not roll away. An appropriately shaped mold is provided to accommodate the shape the molding compound simultaneously for a plurality of devices.

11 Claims, 3 Drawing Sheets

SQUARE BODY LEADLESS ELECTRICAL DEVICE

The present invention relates to discrete electrical components and methods for fabricating same, with particular reference to a power rectifier with an improved construction which not only facilitates fabrication thereof but also facilitates the positioning of the device on a PC board and the making of leadless electrical connection thereto, and to a method for use in fabricating same.

Molded axial lead power rectifiers are normally fabricated with soft copper wire termination leads extending from the ends thereof. Such leads are usually many times the length of the device itself. Because of this, the leads tend to deform during the manufacturing process, resulting in machine jamming and additional costs to restraighten the leads. In addition, the leads occupy a great deal of space, in fact, more space than the body of the device, reducing capacity of machinery an tooling. The care, attention, and special tooling required to handle the delicate leads, plus the scrap resulting from damaged leads, adds unnecessary costs to the device and limits the capacity of the manufacturing equipment.

The latest technology for assembling printed circuit boards, where most power rectifiers are used, involves the use of leadless devices the outer surface of which makes contact with a contact pad on the surface of the printed circuit board, thus eliminating the need for threading wire leads through holes in that board. Initially that technology gained acceptance for the assembly of resistors and capacitors, but it was not until the invention disclosed in McCann U.S. U.S. Pat. No. 4,564,885 of Jan. 14, 1986 entitled "Rectifier With Slug Construction and Mold For Fabricating Same", which patent is owned by the assignee of this application, that leadless device technology was applied to rectifiers, and the entire disclosure of that patent is here incorporated by reference. Briefly stated, the end parts of the devices, integral parts of those devices themselves, were effectively employed to define individual mold cavities into which a suitable insulating plastic compound was molded, the construction and method of manufacture not only giving rise to eminently usable devices, and particularly power rectifiers, but also permitting the simple and inexpensive fabrication of those devices by utilizing a single mold and molding operation to simultaneously produce a substantial number of finished devices.

Leadless devices are so constructed that electrical connection thereto is effected at portions of the exposed outer surfaces of the devices, which portions are in physical and electrical contact with contact pads or the like on the printed circuitboards with which they are to be associated. Even if only one such device is to be used on a board, it is essential that it be accurately located with respect to the terminal pads on the board so that electrical connection to those pads can be made, and when, as is usual, a number of different leadless devices must become a part of a given printed circuit board assembly, the problem of location is exacerbated. To solve that problem it is necessary in the first instance that the devices be properly positioned on the board so that their external surfaces engage the proper terminal pads, but that is only the beginning of the problem. It is also essential that when a device is once properly positioned it remain in that position not only while other devices are being positioned on that board but also during the operations (e.g., soldering) required in order to permanently secure the devices in position and produce proper electrical connection. The end parts of leadless devices are in the form of discs and when, as is shown in the aforementioned U.S. Pat. No. 4,564,885, the outer surface of the molding compound has a cross-section which, like that of the end discs, is circular, the devices when initially placed in position on a board tend to roll from that position and hence present assembly problems. Cylindrically shaped devices of the type disclosed in the aforementioned patent have the advantages of easy manufacturability, ease of handling in manufacturing, low cost and high reliability. Because the cylindrical devices of the type disclosed in said patent can have the same internal construction as corresponding prior art devices with conventional leads, with respect to which the art has much experience in manufacture and use, such cylindrical devices are preferred over flat packages, which will not roll when placed on the printed circuit board but which do not match other electrical characteristics of axial devices because of their different internal construction, but prior to the present invention they have been susceptible to rolling, and hence mis-location, on circuit boards, and this constitutes a significant drawback to their use.

The primary object of the present invention is to devise a basically cylindrical electrical device such as a power rectifier suitable for leadless electrical connection, with all of the advantages known to be present in that type of device, but without the "rollability" disadvantage of that type of device which presented problems in incorporation into printed circuit boards.

It is a further object of the present invention to provide such a device which can be manufactured with the same ease, facility and inexpensiveness as the device of the aforementioned U.S. Pat. No. 4,564,885 but which is more readily and reliably incorporated into printed circuit board assemblies.

It is yet another object of the present invention to devise a mold having all of the advantages of the mold of said U.S. Pat. No. 4,564,885 but which will produced improved products.

In accordance with the above, when the molding compound is formed in place its outer surface is provided with one or more flats which can engage the surface of the board as the device is put into position and hence prevent the device from rolling. In its preferred form, and as here specifically disclosed, the outer surface of the molded body between the electrically conductive pieces of the active device defines a polygon within which the cylindrical outer surfaces of the end pieces are inscribed. The mold is appropriately shaped to that end. In a particularly preferred form that flat-defining portion of the molding compound does not extend over the entire axial distance between the conductive end pieces of the active device, the remainder of the molding compound filling the axial space between the end pieces having a cylindrical outer surface corresponding to that of the end pieces, thus making non-critical the axial location of the active devices in the mold prior to carrying out the molding operation.

To these and to such other objects as may hereinafter appear, the present invention relates to an electrical device construction and to a mold for fabricating that device, as described in this specification and as defined in the appended claims, taken together with the accompanying drawings, in which FIG. 1 is a three-quarter perspective view of a portion of the bottom part of a two-part mold and of portions of a plurality of active devices, e.g., power rectifiers, to be inserted into the mold for the production of the finished devices;

Figure 1:
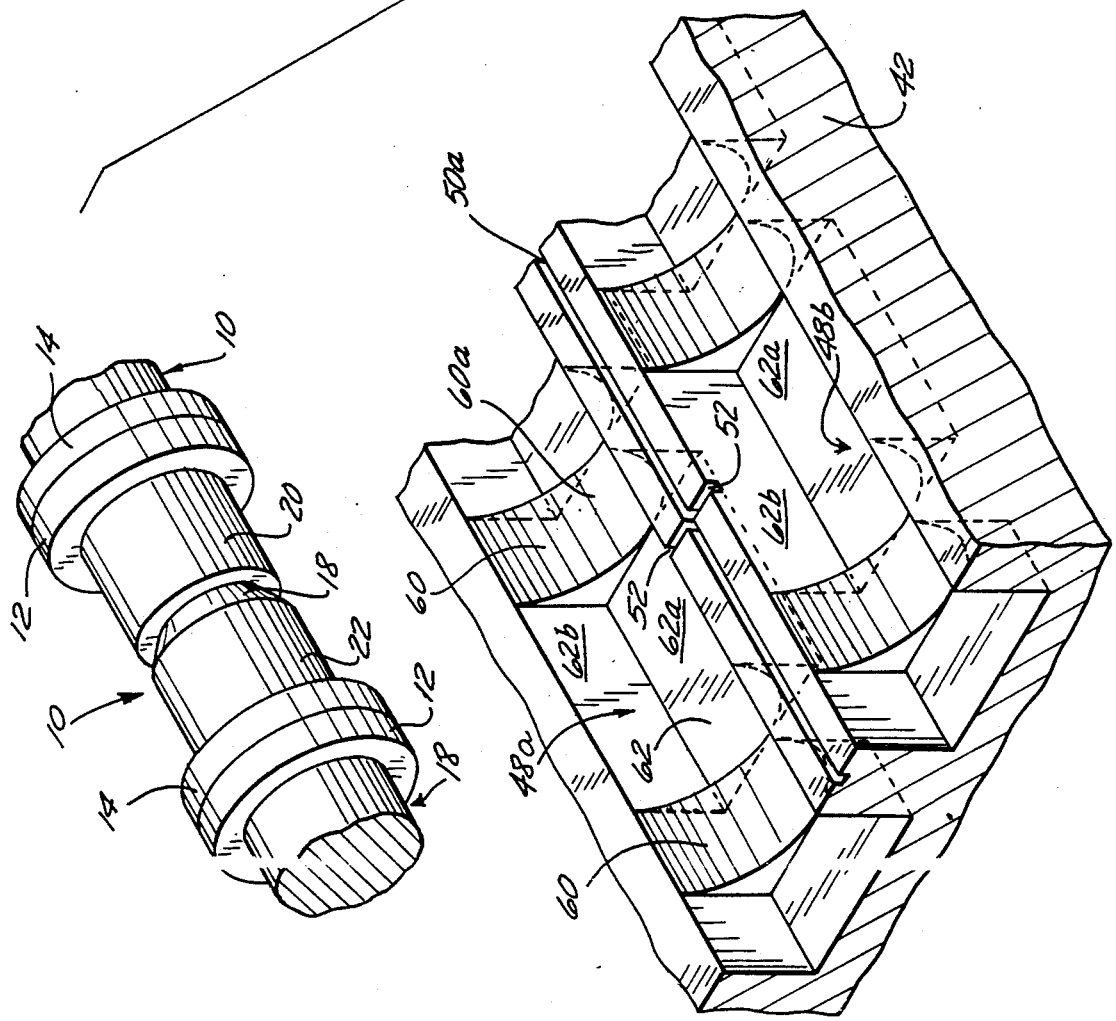

As has been indicated, for purposes of illustration the instant invention is specifically disclosed in connection with the fabrication of leadless electrical power rectifiers. Typical such rectifiers, as here illustrated, comprise a substantially cylindrical central body generally designated 10 and first and second substantially disc-shaped end parts 12 and 14. The end parts 12 and 14 have diameters which are larger than the diameter of the central body 10 such that they extend radially outwardly beyond the surface thereof. The outer surface of body 10 and the interior surfaces of the radially outwardly extending portions of end parts 12 and 14 define a circumferential body recess into which a molding compound 16 such as epoxy is received. Epoxy compound 16 is applied to the device utilizing a unique mold, a preferred structure of which is disclosed in detail below.

Body 10 of the illustrated power rectifier includes a diffused silicon die 18 sandwiched between two slugs 20, 22 preferably composed of molybdenum or the like which are brazed thereto. End parts 12 and 14 are preferably composed of copper and are, in turn, brazed to the exposed ends of slugs 20 and 22. When electrical connection is made to the outer surfaces of the end parts 12 and 14, that in effect places the silicon die 18 in the circuit.

Etching and the application of a glass slurry prior to the application of the epoxy compound 16, and the tin or solder coating of the end parts 12 and 14, are also usually carried out, as pointed out in the aforementioned '885 patent. That patent discloses two alternative constructions for the power rectifier per se, which alternatives, as well as other modifications, are also applicable to this invention.

The mold which is used for the formulation of the devices of the present invention is in many respects similar to that disclosed in the '885 patent, and therefore, to the degree practical, the same reference numerals will be used as in that patent. The mold consists of a top half 40 and a bottom half 42. Each mold half 40, 42 is provided with a plurality of spaced substantially parallel grooves 48a, 48b each having a similar cross-section as described more in detail below, such that when the mold halves are aligned and placed together, as in FIG. 3, a plurality of elongated cavities 48 are formed. Situated between each pair of cavities 48 is a conduit or runner groove 50a which, when mold halves 40 and 42 are placed together, forms a conduit or runner 50 connected to each of the adjacent cavities 48 through a plurality of openings or gates 52 which are situated at spaced intervals along each side of the conduit 50. These openings or gates 52 are so situated at spaced intervals that they will align with the compound-receiving recesses 48a and 48b of the devices when the devices are situated end-to-end within the cavities.

Figure 2:
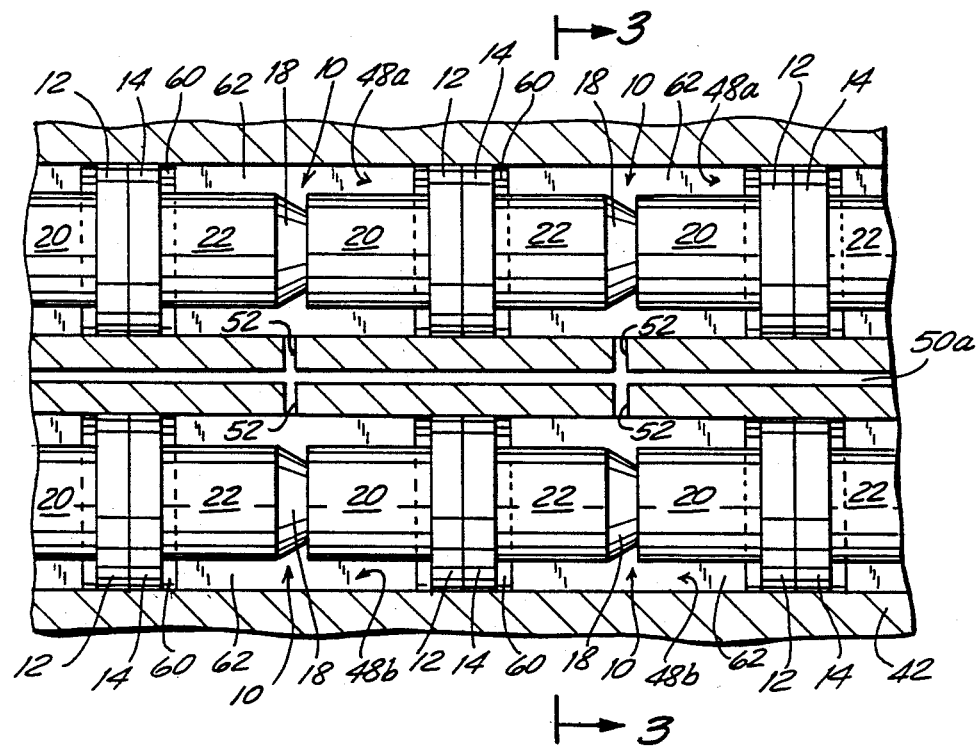
FIG. 2 is a top plan view of the mold of FIG. 1 with a plurality of active devices located therein prior to molding.
Figure 3:
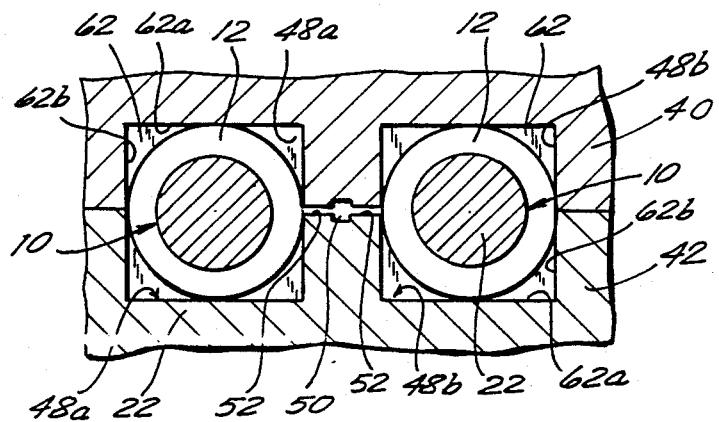
FIG. 3 is a cross-sectional view of the closed mold consisting of the bottom half of the mold of FIGS. 1 and 2 with the correspondingly shaped top half placed thereover and with devices therein, taken along the line 3—3 of FIG. 2.
Figure 4:
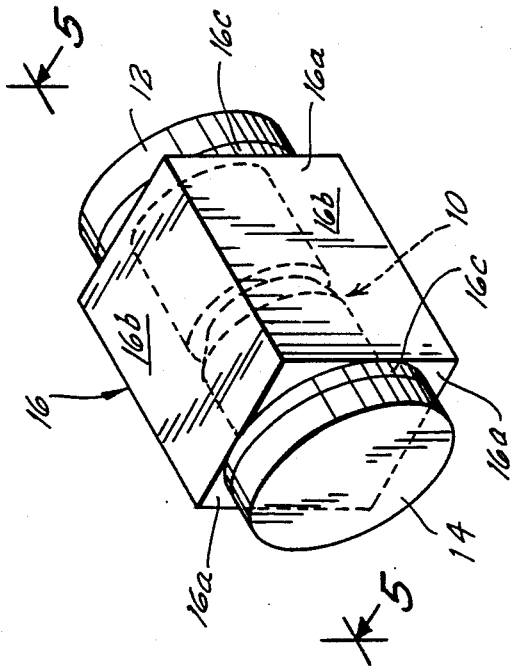
FIG. 4 is a three-quarter perspective view of a single electrical device as formed by the mold of FIGS. 1–3.
Figure 5:
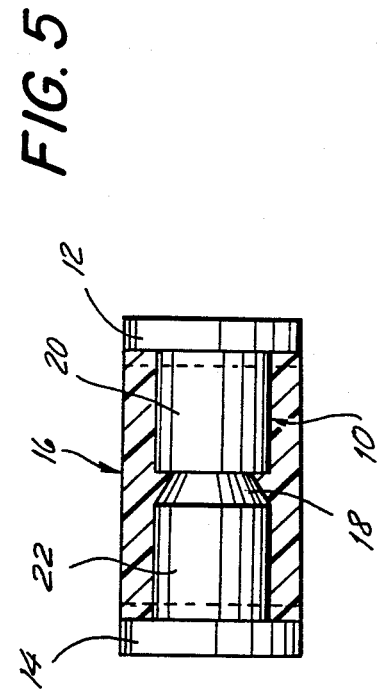
FIG. 5 is a side elevational view of that device taken along the line 5—5 of FIG. 4, showing molding material in cross-section but with the active device in elevation.

The internal surfaces of the cavities 48a and 48b consist of alternating relatively short sections 60 and relatively long sections 62. The exposed surfaces of the section 60 are semi-cylindrical in shape and conform to the outer surfaces of the device end pieces 12 and 14. The sections 62 are defined by generally orthogonal planar bottom or top walls 62a and side walls 62b, with the walls 62a and 62b being essentially tangent to the cylindrical walls 60a of the sections 60 so that, when the top and bottom mold halves 40 and 42 are properly assembled, and as shown in FIG. 3, the cavities formed by the walls 62a and 62b have a polygonal peripheral shape (in this case a square) within which the cylinder defined by the outer surfaces of the end parts 12 and 14 is substantially inscribed, with the corners of the cavity defined by the sections 62 extending radially out beyond the outer surfaces of the end parts 12 and 14. The axial length of the section 62 is somewhat less than the distance between the facing surfaces of the end parts 12 and 14 of a given device, as may best be seen from FIG. 2, the axial length of the section 60 is somewhat greater than the combined thicknesses of the device end parts 12 and 14, and the spacing of the sections 60 and 62 is such as to correspond to the overall lengths of the devices, such that when a plurality of devices are abutted in line, with the end pieces 12 of one device abutting the end pieces 14 of the next device, each pair of abutting end pieces 12, 14 will register with and be received within a mold section 60, the substantially cylindrical body portion 10 of the device being for the most part registering with and received within a section 62. When molding material such as epoxy is forced into the mold through the runner groove 50 and the gates 52, entering and filling the space between the inner surfaces of the mold and the outer surfaces of those portions of the device between the end parts 12 and 14, a device configured as in FIG. 4 results. The molding material 16 will not only fill the space between the end pieces 12 and 14 but will also extend radially out therefrom at the corners 16a of the polygon defined by the flat outer surfaces 16b. As a result, when the device is placed in position on a circuit board one of those flat surfaces 16b will rest on the upper surface of the board and hence the device will not roll. Because the flat outer surfaces 16b are substantially tangent to the cylindrical outer surfaces of the device end parts 12 and 14, those end parts will at the point of tangency physically engage the upper surface of the board on which the device rests, so that proper leadless electrical connection can be effectively accomplished. Because the axial end portions of the molding material, designated 16c in FIG. 4, are cylindrical in nature, corresponding to the shape of the device end pieces 12 and 14, precise axial alignment of the devices within the mold prior to molding is not required and hence slight manufacturing variations in the lengths of those devices will not present any molding problems.

It will be understood that while this invention has been here specifically described with respect to power rectifiers of a particular construction, the invention is of broader applicability. Moreover, if desired, the devices need not be used to take advantage of their leadless potentiality, but could have leads applied thereto if desired, and other variations may be made therein, all without departing from the scope of the present invention, as defined in the following claims.

I claim:

1. An electrical device comprising a unitary elongated body situated between first and second end parts to form a unit, said end parts extending radially beyond the outer surface of said body and defining therebetween a recess, and molding compound in said recess, said molding compound including a portion extending radially out beyond said end parts and having an outer surface which defines flats, said flats on said outer surface defining at least a portion of a polygon within which a projection of the outer surfaces of said first and second end parts is substantially inscribed.

2. The electrical device of claim 1, in which said polygon is regular.

3. The electrical device of claim 1, in which said polygon is a rectangle.

4. The electrical device of claim 1, in which said polygon is a hexagon.

5. The electrical device of claim 1 in which said recess and the molding compound therein extend axially beyond said radially outwardly extending portion.

6. The electrical device of claim 1 in which said recess and the molding compound therein extend axially beyond said radially outwardly extending portion in both directions.

7. The electrical device of claim 1, in which said device is a rectifier, said body comprises the active rectifying elements and said end parts comprise electrical connection elements.

8. An electrical device comprising two end members having substantially circular cross-sections between which a semiconductor die is located, the diameter of said end members being greater than that of said die, and encapsulating material between said end members and around said die, said material defining end portions of substantially circular cross-section adjacent said end members and having diameters substantially the same as the diameters of said end members, and further defining an intermediate portion the outer surface of which defines at least a portion of a polygon within which projections of the outer surfaces of said end portions can be inscribed.

9. The electrical device of claim 8, in which said device is a rectifier.

10. The electrical device of either of claims 8 or 9, in which said polygon is a regular polygon.

11. A mold for applying compound to a plurality of electrical components of the type comprising a body situated between end parts which radially extend beyond the outer surface of the body to form a recess therebetween adapted to receive the molding compound, the mold comprising an elongated cavity adapted to receive a plurality of components end to end, said cavity comprising substantially cylindrical sections alternating with sections the inner surfaces of which define a space having a substantially polygonal cross-section, the diameter of said cylindrical sections being substantially equal to the diameter of said end parts and said polygon defining a shape within which axial projections of said cylindrical sections can be inscribed, said end parts being adapted to be sealingly received in said cylindrical sections, said mold having a plurality of spaced openings communicating with said polygonal sections to permit the molding compound to enter said polygonal sections.

* * * * *